US006356044B1

(12) United States Patent
Archer

(10) Patent No.: US 6,356,044 B1
(45) Date of Patent: Mar. 12, 2002

(54) MOTOR WITH PROGRAMMING MODULE

(75) Inventor: William R. Archer, Fort Wayne, IN (US)

(73) Assignee: General Electric Company, Schenectday, NY (US)

( * ) Notice: Subject to any disclaimer, the term of this patent is extended or adjusted under 35 U.S.C. 154(b) by 0 days.

(21) Appl. No.: 09/454,375

(22) Filed: Dec. 3, 1999

(51) Int. Cl.$^7$ .............................. H02K 5/00; H02K 9/00
(52) U.S. Cl. .................................... 318/538; 388/907.5
(58) Field of Search ................................ 318/138, 254, 318/439, 538, 558; 388/907, 907.5

(56) References Cited

U.S. PATENT DOCUMENTS

| 4,527,230 A | | 7/1985 | Sato et al. ................... 364/130 |
| 4,639,645 A | * | 1/1987 | Hartwig ........................ 318/51 |
| 4,751,438 A | * | 6/1988 | Markunas .................... 318/254 |
| 4,841,206 A | * | 6/1989 | Orii et al. .................... 388/828 |
| 4,922,171 A | * | 5/1990 | Ohi .............................. 318/254 |
| 4,924,158 A | * | 5/1990 | Kelley et al. ................ 318/434 |
| 5,245,258 A | * | 9/1993 | Becker et al. .............. 318/266 |
| 5,592,058 A | | 1/1997 | Archer et al. ............... 318/254 |
| 5,977,733 A | * | 11/1999 | Chen ........................... 318/434 |
| 6,099,324 A | * | 8/2000 | Janssen et al. ............. 439/76.1 |

FOREIGN PATENT DOCUMENTS

| CA | 2148633 | 11/1995 | ............ G06F/19/00 |
| EP | 0 207 168 | 1/1987 | ............ G05B/19/18 |
| EP | 0 264 728 | 4/1988 | ............ H02P/6/02 |
| EP | 0 572 149 | 12/1993 | ............ H02P/6/02 |
| EP | 0 684 692 | 11/1995 | ............ H02P/7/00 |

* cited by examiner

*Primary Examiner*—Bentsu Ro
(74) *Attorney, Agent, or Firm*—Damian Wasserbauer, Esq.; Armstrong Teasdale LLP

(57) ABSTRACT

A motor having a rotor and stator for use with a power supply. A power switching circuit connected between the windings and the power supply selectively energizes windings of the stator to generate the magnetic field applied to the rotor to cause the rotor to rotate. A microprocessor circuit including a microprocessor controls the power switching circuit. A module having a module circuit controls the operation of the microprocessor circuit. A module connector connected to the microprocessor circuit releaseably receives the module. The module connector is within a housing and receives the module and connects the module circuit to the microprocessor circuit. The microprocessor circuit is responsive to the module circuit for controlling the power switching circuit as a function of the module circuit, whereby the operation of the motor is a function of the module circuit.

19 Claims, 3 Drawing Sheets

MOTOR WITH PROGRAMMING MODULE

BACKGROUND OF THE INVENTION

This invention relates to programmable motors and, more particularly, to a motor having a plug-in programmable module and which motor operates in response to information provided by the plug in module.

Many systems include motors which drive a fluid in a system. For example, in heating, ventilating and/or conditioning (HVAC) systems, a motor is used to drive a fan which effects air movement. Depending on the particular environment in which the system is installed, the system and the motor, in particular, must operate according to various parameters and according to various cycles or sequences.

Present motors have a variety of features and operational and system parameters which must be adjusted to optimize performance by providing a proper speed-torque characteristic for a particular application. Further, in many system applications, the starting torque and/or speed torque characteristics of the motor must be predictable and repeatable. In addition, it is desirable that motors be operable at highest reasonably achievable efficiency consistent with mass production techniques. Present concepts and arrangements for adjusting a motor for different field applications require circuit changes such as multiple variable resistors in the electronic control for the motor or permanent software changes in an electronic controlled microprocessor.

Both of the aforementioned arrangements are disadvantageous because they require a unique model to be built for calibrating a system which cannot be easily changed in the field and can be quite expensive.

More recently, a control system and method for a multi-parameter electronically commutated motor has been developed such as disclosed in U.S. Pat. No. 5,592,058, co-assigned to General Electric Company, the entire disclosure of which is incorporated herein by reference. In this system, it is contemplated that the motor drives a component in response to a control signal generated by a microprocessor. The microprocessor is responsive to parameters representative of the system and to a system control signal. The parameters are stored in a memory and are defined in response to a parameter select signal. The control signal provided by the microprocessor controls the speed and torque of the motor. The system further includes an instruction memory for storing instructions controlling the operation of the microprocessor.

Another approach is disclosed in Canadian Patent No. 2,148,633. A drive apparatus for use with a dynamoelectric machine includes a drive means connected to the dynamoelectric machine to control at least one of the current or voltage of the machine. Processing means supplies machine control information to the drive means and includes a first memory means, a program means in the first memory means, a second memory means, and operating characteristic information in either memory means. A switch means connected to the processing means has settings which select operational characteristic information from either memory means.

While present motors have some programmable features, there is a need for a field programmable motor with even greater programming flexibility.

BRIEF SUMMARY OF THE INVENTION

In an exemplary embodiment of the invention, a motor for use with a power supply comprises a rotor, a stator, a power switching circuit, a microprocessor circuit, a housing, a module and a module connector. The stator is coupled to the rotor and has windings for generating a magnetic field applied to the rotor for rotating the rotor relative to the stator. The power switching circuit is connected between the windings and the power supply for selectively energizing the windings to generate the magnetic field applied to the rotor to cause the rotor to rotate. The microprocessor circuit includes a microprocessor controlling the power switching circuit. The housing encloses the rotor, the stator, the power switching circuit and the microprocessor circuit. The module has a module circuit for controlling the operation of the microprocessor circuit. The module connector is within the hosing, accessible through an opening in the housing, connected to the microprocessor circuit and releasably receives the module. The module connector receives the module and connects the module circuit to the microprocessor circuit. The microprocessor circuit is responsive to the module circuit for controlling the power switching circuit as a function of the module circuit, whereby the operation of the motor is a function of the module circuit.

This motor of the invention has a number of advantages over the prior art. Both the microprocessor circuit and the module circuit are programmable. The modules can be selected in the field and installed to control the operation of the motor. The module can be in the form of a printed circuit board which is low in cost to manufacture and may include either a programmable memory or an executable memory or both mounted on the printed circuit board. Switches may be mounted on the printed circuit board to further permit field programmability and selection of the parameters or executable code which control motor operation. The size of inventory needed to support systems is significantly reduced because one motor with several modules can replace the need for an inventory of several motors. The programmability of the microprocessor circuit and the module circuit permit either or both to be reprogrammed in the field.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE INVENTION

Figure 1:
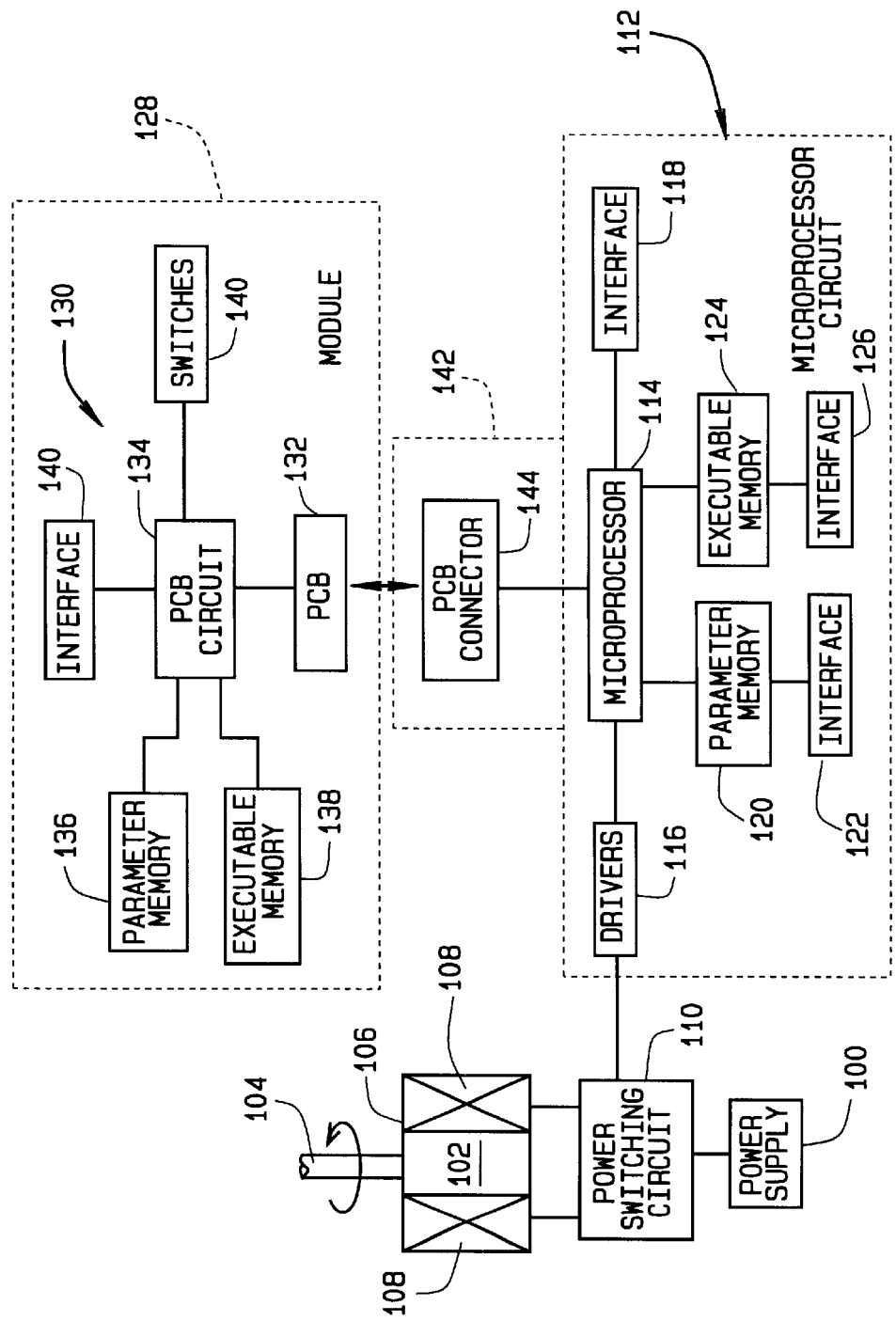
FIG. 1 is a block diagram of one preferred embodiment of a motor of the invention including several optional features.

Referring to FIG. 1, a block diagram of one preferred embodiment of a motor of the invention including several optional features is illustrated. The motor is for use with a power supply 100 such as a 120 VAC or 240 VAC 50 Hz or 60 Hz source. The motor includes a rotor 102 for imparting rotational motion such as to a shaft 104. A stator 106 is coupled to the rotor 102 and has windings 108 for generating a magnetic field applied to the rotor 102 for rotating the rotor 102 relative to the stator 106. In the embodiment described herein, the motor is an electronically commutated motor. However, it is to be understood that aspects of the present invention may be applied to any electronically controllable motor or dynamoelectric machine typically powered by an electronic control circuit. Such motors include, for example, external rotor motors, (i.e., inside out motors), permanent magnet rotors, single and variable speed motors, selectable speed motors having a plurality of speeds, brushless dc motors, electronically commutated motors, switch reluctance motors and induction motors. In addition, the motors may be multi-phase or single phase motors so that the windings would be multi-phase or single phase and, in any case, such motors may have a single split phase winding or a multi-phase winding. Such motors may also provide one or more finite, discrete rotor speeds selected by an electrical switch or other control circuit.

A power switching circuit 110 is connected between the windings 108 and the power supply 100 for selectively energizing the windings 108 to generate the magnetic field applied to the rotor 102 to cause the rotor 102 to rotate. For example, the power switching circuit 110 may be one or more power switches such as switching transistors which selectively connect the power supply 100 to the windings 108. A microprocessor circuit 112 including a microprocessor 114 controls the power switching circuit 110. Although not an essential aspect of the invention, the microprocessor circuit may include a plurality of drivers 116 for controlling the power switching circuit 110. Generally, the low voltage outputs of the microprocessor 114 are converted by the drivers 116 into higher voltage signals which can be used to drive the power switches of the power switching circuit 110. However, it is contemplated that, in certain configurations, microprocessor 114 may directly control the power switching circuit 110.

Optionally, the microprocessor 114 may be connected to an interface 118 such as an RS232 port which allows the microprocessor 114 and/or its memory to be programmed or monitored. In the event that the microprocessor 114 has a built-in memory, the interface 118 may be used to monitor or modify the built-in memory of the microprocessor 114. Alternatively, the microprocessor circuit 112 may include an external parameter memory 120 for storing parameters representative of values or ranges of values of characteristics of the operation of the motor. In this arrangement, the external parameter memory 120 may be accessed via the microprocessor interface 118 and the microprocessor 114. Optionally and alternatively, parameter memory 120 may be provided with a separate parameter memory interface 122 which directly connects to the external parameter memory 120. Similarly, the microprocessor circuit 112 may include an external executable memory 124 storing an executable program executed by the microprocessor 114 for controlling the operation of the power switching circuit 110. The executable memory may be accessed via the interface 118 and microprocessor 114 to store or modify executable programs in the external executable memory 124, which programs would control the operation of the microprocessor 114. Alternatively, a separate interface 126 which is optional may be directly connected to the external executable memory 124 for modifying or storing or monitoring information within the memory 124.

The motor of the invention further includes a plurality of modules 128, each having a module circuit 130 within a housing (not shown) for controlling the operation of the microprocessor circuit 112. Although other configurations are contemplated, it is preferable that the module circuit 130 comprise a printed circuit board (PCB) 132 having a PCB circuit 134 thereon. The printed circuit board 134 would include any one or more of the following: a parameter memory 136, an executable memory 138 or one or more switches 140. In the event that the microprocessor circuit 112 includes a parameter memory 120 or a parameter memory embedded within the microprocessor 114, then the parameter memory 136 would be a supplemental parameter memory. As the only parameter memory, parameter memory 136 stores parameters representative of values or ranges of values of characteristics of the operation of the motor whereby the operation of the motor is a function of the parameters stored in the parameter memory 136. As a supplemental parameter memory, parameter memory 136 stores an additional parameter or parameters for controlling the operation of the microprocessor 114 or storing information selecting or modifying the parameters in the parameter memory 120 including or in addition to any parameter memory which may be embedded in the microprocessor 114. In the event that the microprocessor 112 includes an executable memory 124 or an executable memory embedded within microprocessor 114, then the executable memory 138 would be a supplemental executable memory. As the only executable memory, executable memory 138 would store an executable program or programs controlling the operation of the microprocessor 114. As a supplemental executable memory, executable memory 138 stores additional executable programs executed by the microprocessor 114 for controlling the operation of the power switching circuit 110 or storing information selecting or modifying the executable program in the executable memory 124 or in the embedded executable memory within the microprocessor 114.

Optionally and alternatively, the module circuit 130 may include an interface 140 which is part of the PCB circuit 134 for directly accessing the parameter memory 136 and/or directly accessing the executable memory 138 to monitor, modify or store information in either of these memories.

A module connector 142 is connected to the microprocessor circuit 112 and releasably receives the module 128. In particular, the module connector 142 receives the module 128 and connects the module circuit 130 to the microprocessor circuit 112. As a result, the microprocessor circuit 112 is responsive to the module circuit 130 for controlling the power switching circuit 110 as a function of the module circuit 130 whereby the operation of the motor is a function of the module circuit 130. Preferably, the module connector 142 is a PCB connector 144 for receiving an edge of the PCB 132 of the module 128 (see FIGS. 2–4).

Figure 2:
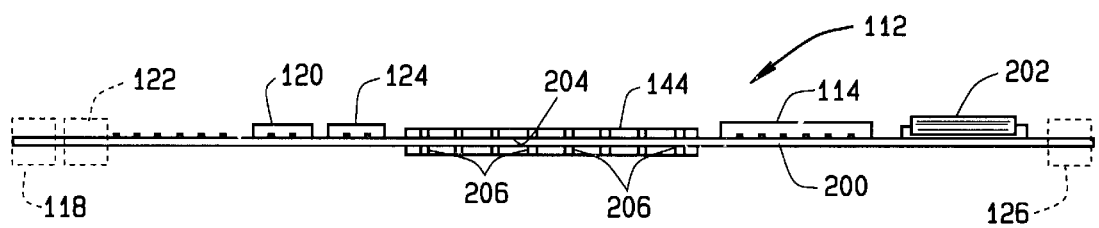
FIG. 2 is an end elevational view of one preferred embodiment of the microprocessor circuit of the invention.

Referring to FIG. 2, an end elevational view of one preferred embodiment of the microprocessor circuit 112 is shown. In this embodiment, the circuit is mounted on a printed circuit board (PCB) 200, although other physical embodiments within the scope of the invention and claims are contemplated. Mounted on PCB 200 are microprocessor 114, parameter memory 120, executable memory 124 and various components 202 which make up the drivers 116. Interfaces 118, 122 and 126 are optional and are shown in phantom. On the front edge of the PCB 200 is mounted the PCB connector 144 having a slot 204 for receiving the module 128. In particular, the slot 204 includes a plurality of contact pads 206 for engaging corresponding contact pads 300 (see FIG. 3) on the module 128. These contact pads 206 are connected to the microprocessor circuit 112 on the printed circuit board 200. When the contact pads 206 engage pads 300 of the module 128, an interconnect is established between the components of 20% the module 128 and the various components of the microprocessor circuit 112.

Figure 3:
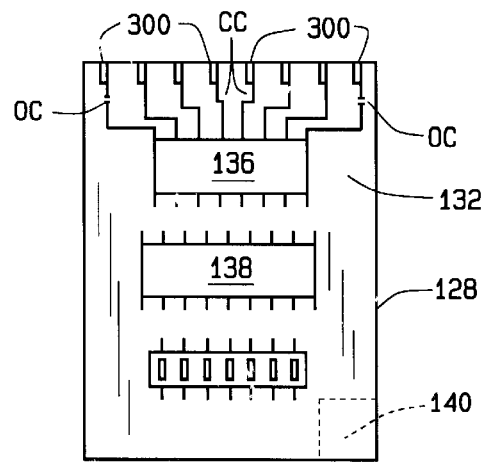
FIG. 3 is a top plan view of one preferred embodiment of a printed circuit board (PCB) module of the invention.

Referring to FIG. 3, a top plan view of one preferred embodiment of a printed circuit board (PCB) 132 forming module 128 of the invention is illustrated. In general, the motor of the invention would have a plurality of modules 128 and an installer would select the particular module to be used with the motor depending on the installation. For each module 128, the PCB 132 has mounted thereon the parameter memory 136, the executable memory 138 and the switches 140. A plurality of pads or tabs 300 are provided at the end of the PCB 132 and are electrically connected to the PCB circuit 134. When the selected module 128 is inserted into the connector 144, the tabs 300 electrically connect to the pads 206 thereby electrically connecting the memories and/or switches of the module 128 to the microprocessor circuit 112.

Figure 4:
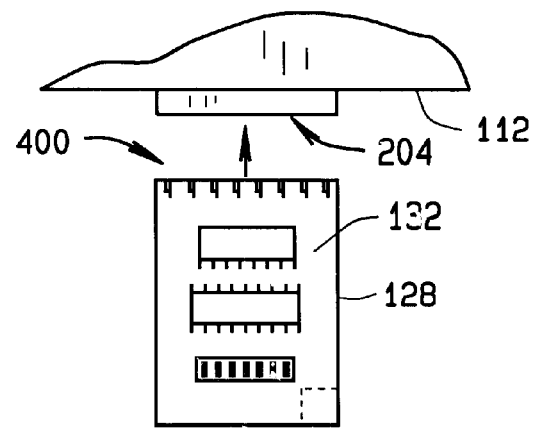
FIG. 4 is a schematic top plan view of the microprocessor circuit of FIG. 2 in a position about to engage and receive the PCB module of FIG. 3.

Referring to FIG. 4, a schematic top plan view of the microprocessor circuit 112 in position about to engage and receive the module 128 is illustrated. In particular, a front edge 400 of the PCB 132 of module 128 including the tabs 300 is inserted into the slot 204. As a result, pads 206 are aligned and in contact with tabs 300.

Figure 5:
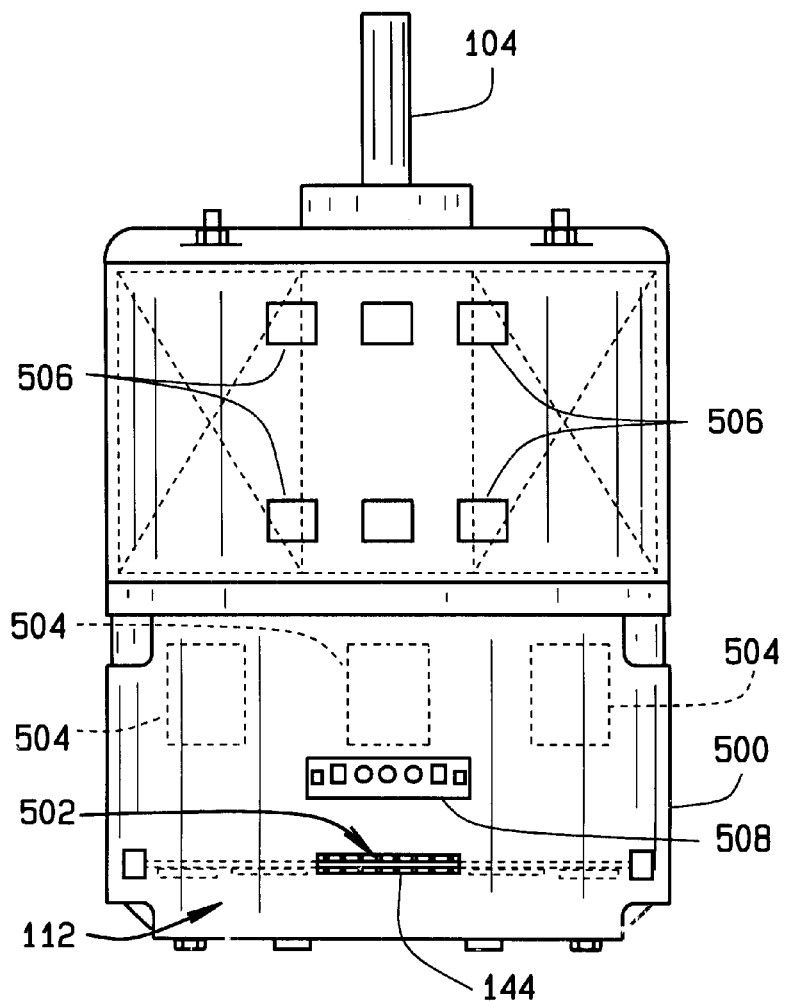
FIG. 5 is a side elevational view of one preferred embodiment of a motor housing of the invention.

Referring to FIG. 5, a side elevational view of one preferred embodiment of a motor housing 500 of the invention is illustrated. The motor housing 500 has an opening 502 through which the PCB connector 144 can be accessed. The microprocessor circuit 112 is shown in phantom within the lower portion of the motor housing 500. Also shown in phantom are the power switches 504 of the power switching circuit 110. Optionally, the housing may be provided with drain holes 506 for allowing water to drain from the rotor 102, the stator 106 and the microprocessor circuit 112. Also, the power supply 100 for connecting to the power switching circuit 110 may be connected via a harness or connector or other means through an access opening 508. Consequently, the housing 500 encloses the rotor 102, the stator 106, the power switching circuit 110 and the microprocessor circuit 112. The module connector 142 is located within the housing and is accessible through the opening 508.

It is also contemplated that the module circuit 130 may have a printed circuit 134 thereon which forms an open circuit OC or a closed circuit CC (See FIG. 3). In this embodiment, the open circuit corresponds to a permanently open switch which selects a particular parameter for operating the motor. Similarly, the closed circuit corresponds to a permanently closed switch which selects a particular parameter for operating the motor.

In operation, an installer would bring to the point of sale or the installation site a single motor (i.e., a universal motor) with several modules 128 which would program the motor to operate in different ways. The installer would select a particular module 128 depending on the installation environment. Alternatively, the installer may operate the motor with two or three different modules to test each one and determine by analysis which module is best suited for the particular installation. Alternatively, the installer could use one of the interfaces to customize the parameters or executable programs of the module 128 and/or the microprocessor circuit 112 by engaging the interface with an external programming device.

In view of the above, it will be seen that the several objects of the invention are achieved and other advantageous results attained.

As various changes could be made in the above products without departing from the scope of the invention, it is intended that all matter contained in the above description and shown in the accompanying drawings shall be interpreted as illustrative and not in a limiting sense.

What is claimed is:

1. A motor for use with a power supply comprising:
    a rotor;
    a stator coupled to the rotor and having windings for generating a magnetic field applied to the rotor for rotating the rotor relative to the stator;
    a power switching circuit connected between the windings and the power supply for selectively energizing the windings to generate the magnetic field applied to the rotor to cause the rotor to rotate;
    a microprocessor circuit including a microprocessor controlling the power switching circuit;
    a housing enclosing the rotor, the stator, the power switching circuit and the microprocessor circuit;
    a module having a module circuit for controlling the operation of the microprocessor circuit; and
    a module connector within the housing and accessible through an opening in the housing, said module connector connected to the microprocessor circuit and releasably receiving the module, said module connector receiving the module and connecting the module circuit to the microprocessor circuit, said microprocessor circuit being responsive to the module circuit for controlling the power switching circuit as a function of the module circuit, whereby the operation of the motor is a function of the module circuit.

2. The motor of claim 1 wherein the module circuit includes an executable memory storing an executable program executed by the microprocessor to control the operation of the power switching circuit.

3. The motor of claim 2:
    wherein the module comprises a printed circuit board (PCB);
    wherein the module circuit comprises a PCB circuit on the PCB, the PCB circuit including the executable memory; and
    wherein the module connector comprises a PCB connector connected to the microprocessor circuit for receiving the PCB and connecting the PCB circuit to the microprocessor circuit, said microprocessor circuit being responsive to the PCB circuit for controlling the power switching circuit as a function of the executable memory.

4. The motor of claim 1 wherein said microprocessor circuit has an executable memory storing an executable program executed by the microprocessor to control the operation of the power switching circuit and wherein the module circuit includes a supplemental executable memory storing an additional executable program executed by the microprocessor to control the operation of the power switching circuit or storing information selecting or modifying the executable program in the executable memory of the microprocessor circuit.

5. The motor of claim 4 wherein the module circuit further comprises at least one switch, the position of which selects a particular executable program in the executable memory or in the supplemental executable memory or selects a particular parameter for operating the power switching circuit.

6. The motor of claim 4 wherein the module circuit further comprises a printed circuit having an open circuit or a closed circuit which selects a particular executable program or a parameter for operating the motor.

7. The motor of claim 4 wherein the module circuit further comprises a parameter memory storing parameters representative of values or ranges of values of characteristics of the operation of the motor.

8. The motor of claim 1 wherein the module circuit includes a parameter memory storing parameters representative of values or ranges of values of characteristics of the operation of the motor whereby the operation of the power switching circuit is a function of the parameters stored in the parameter memory.

9. The motor of claim 8:
wherein the module comprises a printed circuit board;
wherein the module circuit comprises a PCB circuit on the PCB, the PCB circuit including the parameter memory; and
wherein the module connector comprises a PCB connector connected to the microprocessor circuit for receiving the PCB and connecting the PCB circuit to the microprocessor circuit, said microprocessor circuit being responsive to the PCB circuit for controlling the power switching circuit as a function of the parameter memory.

10. The motor of claim 1 wherein said microprocessor circuit has a parameter memory storing parameters representative of values or ranges of values of characteristics of the operation of the motor and wherein the module circuit includes a supplemental parameter memory storing an additional parameter for controlling the operation of the motor or storing information selecting or modifying the parameters in the parameter memory.

11. The motor of claim 10 wherein the module circuit further comprises at least one switch, the position of which selects a particular executable program or a particular parameter for operating the power switching circuit.

12. The motor of claim 10 wherein the module circuit further comprises a printed circuit having an open circuit or a closed circuit which selects a particular executable program or a particular parameter for operating the motor.

13. The motor of claim 10 wherein the module circuit further comprises an executable memory storing an executable program controlling the operation of the microprocessor whereby the operation of the motor is a function of the executable program stored in the executable memory.

14. The motor of claim 1 further comprising a plurality of different modules, one of which is selected by an operator to engage the module connector.

15. The motor of any of claims 5–11 or 12 wherein the parameters in the parameter memory or in the supplemental parameter memory include one or more of the following: parameters defining speed or air flow rate for a heating mode and a cooling mode when the motor drives an air handler; parameters defining speed or air flow rates for different system capacities when the motor is part of an HVAC system; parameters defining turn-on and turn-off time delays of the motor; parameters defining motor speed or torque changes over time; parameters defining the relationship between motor torque and air flow; parameters defining the relationship between motor speed and air flow when the motor drives an air handler; and parameters defining direction of rotation.

16. The motor of claims 2, 4, 7, 8, 10 or 13 wherein each of the executable memory, the supplemental executable memory, the parameter memory and/or the supplemental parameter memory is a programmable memory programmable by an external computer and further comprising an interface for interfacing the external computer to the programmable memory.

17. The motor of claim 1 wherein the module circuit further comprises at least one switch, the position of which selects a particular executable program or a parameter used by the microprocessor for operating the power switching circuit.

18. The motor of claim 17 wherein the module circuit includes an executable memory storing an executable program executed by the microprocessor to control the operation of the power switching circuit.

19. The motor of claim 17 wherein the module circuit includes a parameter memory storing parameters representative of values or ranges of values of characteristics of the operation of the motor whereby the operation of the power switching circuit is a function of the parameters stored in the parameter memory.

* * * * *